(12) United States Patent
Mallik et al.

(10) Patent No.: US 12,183,649 B2
(45) Date of Patent: Dec. 31, 2024

(54) IC PACKAGE INCLUDING MULTI-CHIP UNIT WITH BONDED INTEGRATED HEAT SPREADER

(71) Applicant: Intel Corporation, Santa Clara, CA (US)

(72) Inventors: Debendra Mallik, Chandler, AZ (US); Ravindranath Mahajan, Chandler, AZ (US); Digvijay Raorane, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 18/222,855

(22) Filed: Jul. 17, 2023

(65) Prior Publication Data

US 2023/0360994 A1 Nov. 9, 2023

Related U.S. Application Data

(63) Continuation of application No. 18/089,536, filed on Dec. 27, 2022, which is a continuation of application
(Continued)

(51) Int. Cl.
*H01L 23/367* (2006.01)
*H01L 21/48* (2006.01)
(Continued)

(52) U.S. Cl.
CPC ........ *H01L 23/367* (2013.01); *H01L 21/4853* (2013.01); *H01L 21/56* (2013.01);
(Continued)

(58) Field of Classification Search
CPC .............. H01L 23/367; H01L 23/3107; H01L 23/5386; H01L 23/3128; H01L 23/49568;
(Continued)

(56) References Cited

U.S. PATENT DOCUMENTS 9,252,135 B2 2/2016 Yu
9,735,131 B2 8/2017 Su
(Continued)

*Primary Examiner* — Alonzo Chambliss
(74) *Attorney, Agent, or Firm* — Schwabe, Williamson & Wyatt, P.C.

(57) ABSTRACT

A multi-chip unit suitable for chip-level packaging may include multiple IC chips that are interconnected through a metal redistribution structure, and that are directly bonded to an integrated heat spreader. Bonding of the integrated heat spreader to the multiple IC chips may be direct so that no thermal interface material (TIM) is needed, resulting in a reduced bond line thickness (BLT) and lower thermal resistance. The integrated heat spreader may further serve as a structural member of the multi-chip unit, allowing a second side of the redistribution structure to be further interconnected to a host by solder interconnects. The redistribution structure may be fabricated on a sacrificial interposer that may facilitate planarizing IC chips of differing thickness prior to bonding the heat spreader. The sacrificial interposer may be removed to expose the RDL for further interconnection to a substrate without the use of through-substrate vias.

20 Claims, 8 Drawing Sheets

Related U.S. Application Data

No. 17/234,671, filed on Apr. 19, 2021, now Pat. No. 11,581,235, which is a continuation of application No. 16/529,617, filed on Aug. 1, 2019, now Pat. No. 11,011,448.

(51) Int. Cl.
| | |
|---|---|
| *H01L 21/56* | (2006.01) |
| *H01L 23/00* | (2006.01) |
| *H01L 23/31* | (2006.01) |
| *H01L 23/495* | (2006.01) |
| *H01L 23/538* | (2006.01) |

(52) U.S. Cl.
CPC ........ *H01L 21/565* (2013.01); *H01L 23/3107* (2013.01); *H01L 23/3128* (2013.01); *H01L 23/49568* (2013.01); *H01L 23/5386* (2013.01); *H01L 24/08* (2013.01); *H01L 24/16* (2013.01); *H01L 24/20* (2013.01); *H01L 24/24* (2013.01); *H01L 24/29* (2013.01); *H01L 24/83* (2013.01); *H01L 2224/02371* (2013.01); *H01L 2924/181* (2013.01)

(58) Field of Classification Search
CPC ... H01L 21/4853; H01L 21/565; H01L 21/56; H01L 24/07; H01L 24/15; H01L 24/24; H01L 24/83; H01L 24/20; H01L 24/28; H01L 24/04; H01L 2224/02371; H01L 2924/181
See application file for complete search history.

(56) References Cited

U.S. PATENT DOCUMENTS

| | | | |
|---|---|---|---|
| 11,011,448 B2 | 5/2021 | Mallik | |
| 11,581,235 B2 | 2/2023 | Mallik | |
| 11,670,518 B2 * | 6/2023 | Jin | H01L 23/49816 257/668 |
| 11,749,577 B2 * | 9/2023 | Mallik | H01L 24/16 257/713 |
| 2007/0108597 A1 | 5/2007 | Kim | |
| 2008/0142954 A1 | 6/2008 | Hu | |
| 2008/0142955 A1 | 6/2008 | Chen | |
| 2008/0157341 A1 | 7/2008 | Yang | |
| 2013/0099377 A1 | 4/2013 | Yu | |
| 2013/0217188 A1 * | 8/2013 | Wang | H01L 23/433 438/118 |
| 2013/0273694 A1 * | 10/2013 | Hsieh | H01L 23/427 257/E21.606 |
| 2014/0264820 A1 * | 9/2014 | Hu | H01L 23/3736 257/713 |
| 2015/0021754 A1 | 1/2015 | Lin | |
| 2015/0214127 A1 | 7/2015 | Gu | |
| 2015/0270190 A1 | 9/2015 | Kim | |
| 2015/0380334 A1 | 12/2015 | Hu | |
| 2016/0049350 A1 * | 2/2016 | Matsuda | H01L 23/36 165/185 |
| 2016/0276307 A1 | 9/2016 | Lin | |
| 2017/0084596 A1 * | 3/2017 | Scanlan | H01L 23/3675 |
| 2018/0226333 A1 | 8/2018 | Shih | |
| 2018/0261586 A1 * | 9/2018 | Scanlan | H01L 24/96 |
| 2019/0096816 A1 | 3/2019 | Ho | |
| 2020/0273811 A1 * | 8/2020 | Mallik | H01L 23/3114 |

* cited by examiner

IC PACKAGE INCLUDING MULTI-CHIP UNIT WITH BONDED INTEGRATED HEAT SPREADER

CLAIM FOR PRIORITY

This application is a continuation of U.S. patent application Ser. No. 18/089,536, filed Dec. 27, 2022, which is a continuation of U.S. patent application Ser. No. 17/234,671, filed Apr. 19, 2021, now U.S. Pat. No. 11,581,235, issued Feb. 14, 2023, which is a continuation of and claims priority to U.S. patent application Ser. No. 16/529,617, filed on Aug. 1, 2019, now U.S. Pat. No. 11,011,448, issued May 18, 2021, and titled IC PACKAGE INCLUDING MULTI-CHIP UNIT WITH BONDED INTEGRATED HEAT SPREADER, which are incorporated by reference in their entirety.

BACKGROUND

In electronics manufacturing, integrated circuit (IC) packaging is a stage of semiconductor device fabrication in which an IC that has been fabricated on a chip (or die) comprising a semiconducting material is encapsulated in a "package" that can protect the IC from physical damage and support electrical contacts that connect the IC to a host component, such as a printed circuit board.

Multiple chips can be assembled into a single IC package. In some multi-chip packages the IC chips may be interconnected through a package substrate that is further interconnected to a host substrate. Integration of multiple IC chips is another technology for cost-effectively assembling complex and high performance microelectronic systems. In chip-level integration, multiple IC chips are electrically interconnected by some means that is scaled down from the package substrate to form a multi-chip unit. The multi-chip unit may then be packaged essentially as a single IC chip, for example being assembled onto a package substrate in the same manner as a conventional monolithic IC chip.

Such multi-chip units may advantageously combine IC chips from heterogeneous silicon processes and/or combine small dis-aggregated chips from the same silicon process. However, there are many challenges with integrating multiple IC chips into such a chip-scale unit. One issue is structural/mechanical strength of the multi-chip unit because chip-electrical interconnection may comprise only thin metallization layers embedded within structurally weak thin film dielectric layers (silicon dioxide, low-K dielectrics, silicon nitride, polymer, etc.) that span an aggregate footprint of the IC chips. Such thin film materials are prone to cracking. Additionally, compound chip units often suffer high warpage, which makes their further interconnection to a host, such as a package substrate, difficult. Another issue is thermal performance because, compared to a monolithic IC chip (e.g., one having approximately the same footprint of a multi-chip unit), the various small IC chips assembled together are less capable of spreading heat across the assembly due, at least in part, to relatively poor thermal conductivity in regions between the individual IC chips. For example, a dielectric mold material that might backfill between the IC chips may have a thermal conductivity of only around 2.5 W/mK, or less. Multi-die integration therefore tends to suffer from more hot spots than comparably sized single-chip packages. Thermal performance may also be poor where the IC chips of a multi-chip unit have differing thicknesses so that more material of relatively poor thermal conductivity (e.g., mold material or thermal interface material) may be needed between the individual IC chips and any overlying package-level thermal solution. Thermal conduction within both an x-y plane and a z-height of the multi-chip assemblies may therefore be poor.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels are repeated among the figures to indicate corresponding or analogous elements. In the figures.

DETAILED DESCRIPTION OF EXEMPLARY EMBODIMENTS

Figure 1:
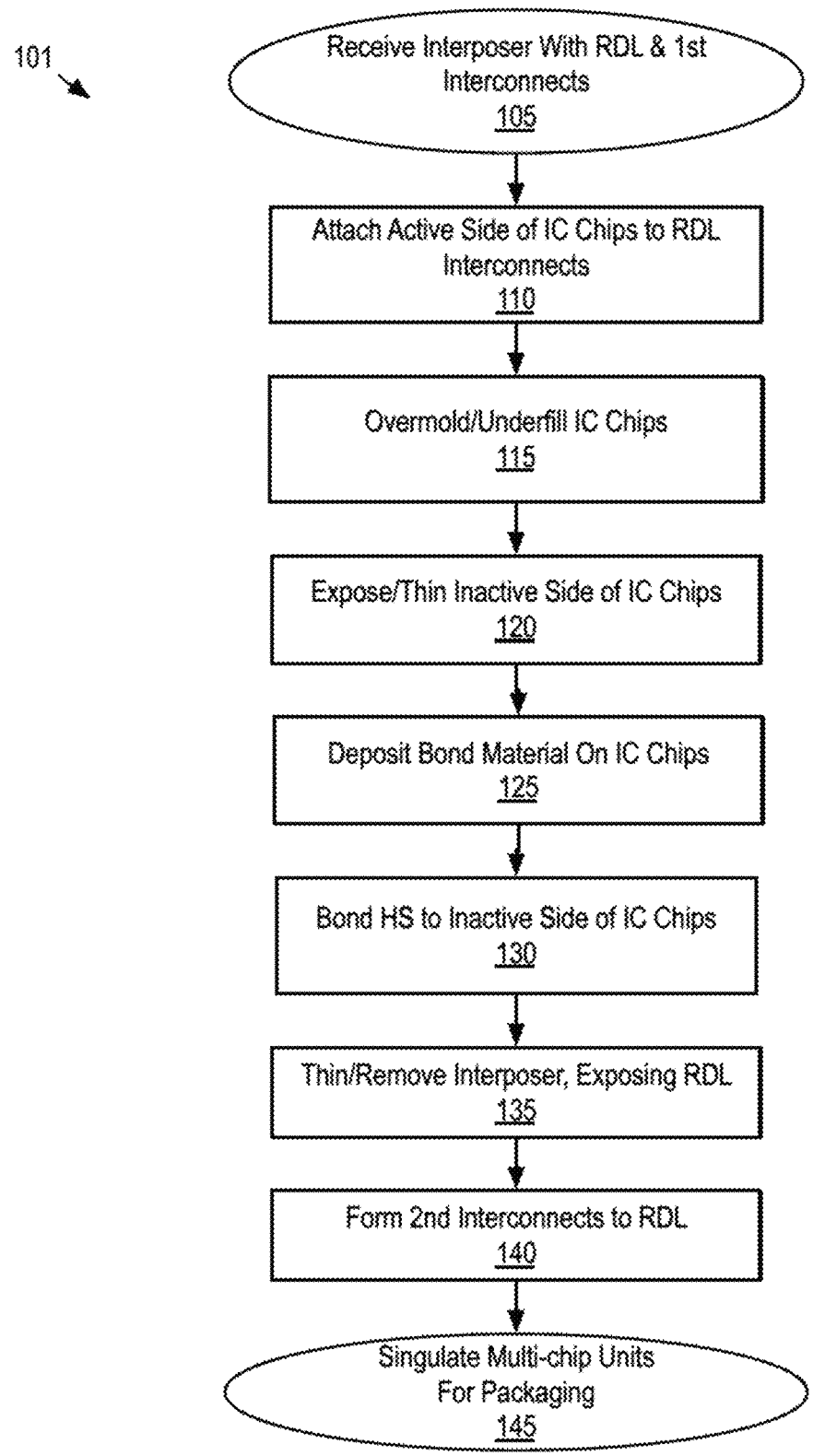
FIG. 1 illustrates a flow diagram of methods for integrating multiple IC chips within a chip-scale unit, in accordance with some embodiments.

Embodiments are described with reference to the enclosed figures. While specific configurations and arrangements are depicted and discussed in detail, it should be understood that this is done for illustrative purposes only. Persons skilled in the relevant art will recognize that other configurations and arrangements are possible without departing from the spirit and scope of the description. It will be apparent to those skilled in the relevant art that techniques and/or arrangements described herein may be employed in a variety of other systems and applications other than what is described in detail herein.

Reference is made in the following detailed description to the accompanying drawings, which form a part hereof and illustrate exemplary embodiments. Further, it is to be understood that other embodiments may be utilized and structural and/or functional changes may be made without departing from the scope of claimed subject matter. It should also be noted that directions and references (e.g., up, down, top, bottom, etc.) may be used merely to facilitate the description of features in the drawings and relationship between the features. Therefore, the following detailed description is not to be taken in a limiting sense and the scope of claimed subject matter is defined solely by the appended claims and their equivalents.

In the following description, numerous details are set forth. However, it will be apparent to one skilled in the art, that embodiments may be practiced without these specific details. In some instances, well-known methods and devices are shown in block diagram form, rather than in detail, to avoid obscuring the embodiments. Reference throughout this specification to "an embodiment" or "one embodiment" or "some embodiments" means that a particular feature, structure, function, or characteristic described in connection with the embodiment is included in at least one embodiment. Thus, the appearances of the phrase "in an embodiment" or "in one embodiment" or "some embodiments" in various places throughout this specification are not necessarily referring to the same embodiment. Furthermore, the particular features, structures, functions, or characteristics may be combined in any suitable manner in one or more embodiments. For example, a first embodiment may be combined with a second embodiment anywhere the particular features, structures, functions, or characteristics associated with each of the two embodiments are not mutually exclusive.

As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical, optical, or electrical contact with each other, and/or that the two or more elements co-operate or interact with each other (e.g., as in a cause an effect relationship).

The terms "over," "under," "between," and "on" as used herein refer to a relative position of one component or material with respect to other components or materials where such physical relationships are noteworthy. For example in the context of materials, one material or structure disposed over or under another may be directly in contact or may have one or more intervening materials. Moreover, one material disposed between two materials may be directly in contact with the two materials or may have one or more intervening materials. In contrast, a first material or structure "on" a second material or structure is in direct contact with that second material/structure. Similar distinctions are to be made in the context of component assemblies where a first component may be "on" or "over" a second component.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

Examples of multi-chip IC packages including multiple IC chips that are interconnected and bonded to a heat spreader are provided below. In some advantageous embodiments, the heat spreader is directly bonded (e.g., by sintering) to a surface of each IC chip, ensuring a minimal bond line thickness (BLT). In some embodiments, the IC chips are interconnected by one or more redistribution layers (RDL) that are first fabricated upon a sacrificial interposer, and subsequently separated from the interposer after mechanical support of the IC chip and RDL structure is augmented by bonding the heat spreader. The sacrificial interposer may be leveraged during a planarization of the IC chips, facilitating the low BLT between the heat spreader and multiple IC chips of various thicknesses and/or flatness.

The multi-chip units described herein may be assembled and/or fabricated with one or more of the features or attributes provided in accordance with various embodiments. A number of different assembly and/or fabrication methods may be practiced to generate a multi-chip unit having one or more of the features or attributes described herein. FIG. 1 illustrates a flow diagram of assembly methods 101 suitable for assembling a multiple chip unit including a bonded integrated heat spreader, and interconnected through an RDL structure, in accordance with some embodiments. Methods 101 may be employed to generate any of the multi-chip unit described herein, for example. FIG. 2A-2F illustrate cross-sectional views of a multi-chip unit evolving as the methods illustrated in FIG. 1 are practiced, in accordance with some exemplary embodiments.

Referring first to FIG. 1, methods 101 begin at block 105 where an interposer, or other material preform to which multiple IC chips may be attached, is received as an input. In some exemplary embodiments, the interposer is a silicon wafer, which may be of any diameter (e.g., 300 mm, etc.). Other materials known to be suitable alternatives for silicon may also be employed as an interposer. The interposer has sufficient thickness to provide adequate mechanical strength for IC chip attachment. One or more metallized redistribution levels embedded within dielectric material(s) are present on an active side of the interposer. The RDL structure is much thinner than the interposer, comprising material layers that have been deposited, plated or laminated upon the interposer. The RDL includes, or is connected to, metal chip interconnect features that protrude a predetermined z-height from the active surface, and may be subsequently electrically connected to an IC chip. The metal interconnect features may comprise solder or any other metal suitable for die attachment. For solder embodiments, any top-side solder attachment process (e.g., ball attach, paste dispense, etc.) may be practiced to form the metal interconnect features upon the RDL structure. For non-solder embodiments, any metal plating process may be practiced, such as copper and/or nickel electrolytic or electroless plating, to form interconnect pillars. The interconnect pillars may then be directly bond to the IC chip, or there may be a hybrid bond formed both between dielectric of the IC chip and RDL structure and between metallization features of the IC chip and RDL structure.

Figure 2A:
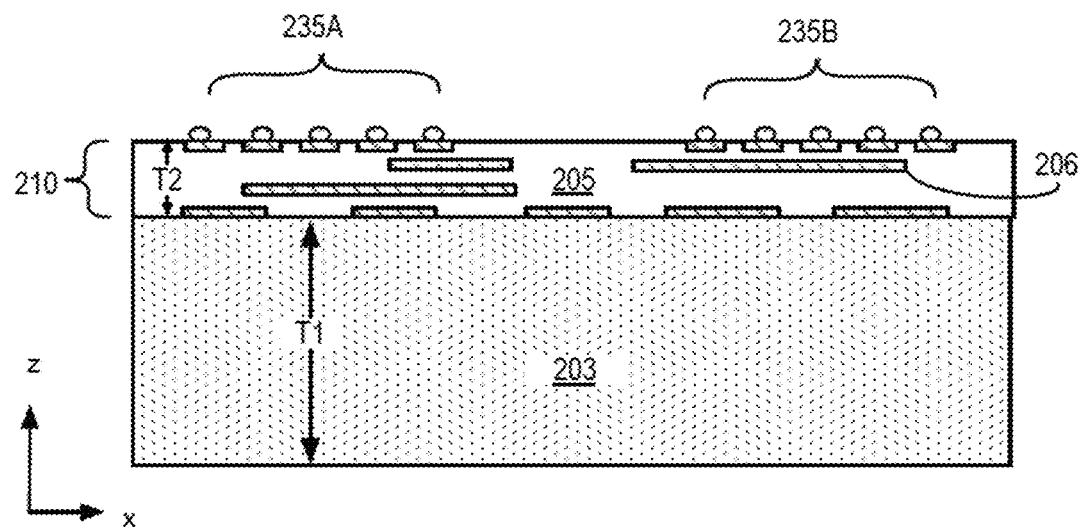
FIGS. 2A, 2B, 2C, 2D, 2E, and 2F illustrate cross-sectional views of a multi-chip unit evolving as the methods illustrated in FIG. 1 are practiced, in accordance with some embodiments.

In the example further illustrated in FIG. 2A, interposer 203 comprises predominantly silicon (e.g., substantially single crystalline silicon). Interposer 203 has a thickness T1, which may range from 400 μm to 750 μm, for example. RDL structure 210 has a total thickness T2, which is advantageously less than 50 μm (e.g., 10, 20, 30 μm, etc.), for example. RDL structure 210 includes one or more levels of metallization 206 embedded within dielectric material(s) 205. Metallization 206 may comprise any suitable metal(s), such as, but not limited to, copper alloys. As further illustrated, a first set of solder interconnect features 235A are electrically coupled to a first region of RDL structure 210, while a second set of solder interconnect features 235B are electrically coupled to a second region of RDL structure 210. Solder interconnect features 235A, and 235B may comprise any solder alloy suitable as a first level interconnect (FLI), such as, but not limited to, Sn alloys (e.g., SAC).

Returning to FIG. 1, methods 101 continue at block 110 where a plurality of IC chips is attached to the RDL interconnect features. An active side of each IC chip is affixed to a subset of the RDL interconnect features. Any die attach technique known in the art may be employed to attached any number of IC chips to the RDL interconnect features. The die may be bonded through Cu—Cu bump or pillar boding, for example, where Cu features on the active chip surface are bonded to Cu features of the RDL structure. Since both IC chip surface and the RDL surface include metallization and dielectric (e.g., SiO2), block 110 may entail hybrid bonding where attachment comprises both Cu—Cu bonds and dielectric (SiO2-SiO2) bonds. Each IC chip may have any integrated circuitry fabricated according to any IC technology (e.g., Si CMOS, SiGe, III-V or III-N HEMTs, etc.). The various IC chips that are to be interconnected electrically by the RDL may also have any mixture of circuitries and/or technologies. At block 115 any suitable package overmold/underfill process may be practiced to apply a dielectric mold material around, and potentially over, the attached IC chips.

Figure 2B:
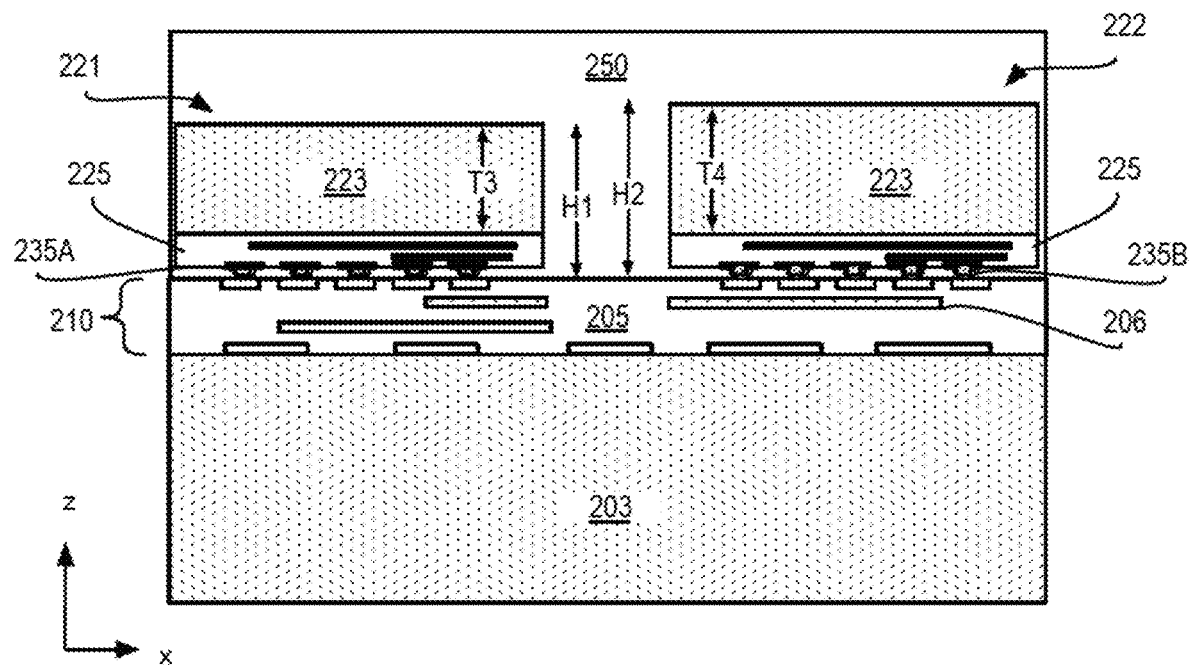

In the example further illustrated in FIG. 2B, a flip-chip process has been employed to attach an active surface of IC chips 221 and 222 to solder interconnect features 235A and 235B, respectively. Upon reflowing solder interconnects 235A and 235B, IC chips 221 and 222 are permanently interconnected to each other through RDL structure 210 with the assembly supported by interposer 203. As an example, IC chip 221 may be a first of any of a wireless radio circuit, microprocessor circuit, electronic memory circuit, floating point gate array (FPGA), power management and/or power supply circuitry, or MEMS device. As a further example, IC chip 222 may be a second of any of a wireless radio circuit, microprocessor circuit, electronic memory circuit, FPGA, power management and/or power supply circuitry, or MEMS device. IC chips 221 and 222 may have originated from a different IC chip/wafer manufacturer or may have been diced from a single semiconductor wafer. IC chips 221, 222 may each have been prepared and electrically tested, for example according to any suitable die prep and e-test process.

As shown in FIG. 2B, each IC chip 221 and 222 includes an active region 225 comprising one or more device (e.g., transistor) levels interconnected into a monolithic IC. One or more pillars or other metallization features suitable for contacting RDL interconnects 235A, 235B may protrude from active region 225. Each IC chip 221, 222 further includes an inactive chip substrate 223. In some embodiments, chip substrate 223 is predominantly single-crystalline silicon, but it may be any other semiconductor, for example. In the illustrated example, IC chip 221 has an assembly height H1 that is significantly less than assembly height H2. In this example, the difference between assembly heights H1 and H2 is primarily attributable to a difference in thickness of chip substrate 223 (with T3 being less than T4). Assembly heights H1 and H2 may also vary between IC chips 221, 222 as a result of variation in the die attachment process, for example.

As further shown in FIG. 2B, a mold material 250 covers IC chips 221, 222, and is adjacent to a sidewall of chip substrate 223. Mold material 250 is also adjacent to solder features 235A, 235B, and is in contact with a surface of RDL structure 210. Mold material 250 may have a relatively low electrical conductivity, with mold material 250 advantageously being a dielectric. Mold material 250 may be any alternative material known to be suitable for IC chip packaging applications. In some exemplary embodiments, mold material 250 comprises a cured (e.g., thermoset) resin or polymer comprising epoxy and/or silicone. Mold material 250 may also comprise a variety of fillers. In some embodiments, mold material 250 has a relatively low bulk thermal conductivity (e.g., less than 5 W/mK), and may, for example, have a bulk thermal conductivity in the range of 1-4 W/mK.

Returning to FIG. 1, methods 100 continue at block 120 where the mold material is planarized to expose the inactive (back) side of the IC chips. For example, a grind and/or polish process may partially remove and/or planarize the mold material to expose the inactive side of each of the IC chips. Such a planarization process leverages planarity and rigidity of the interposer. The planarization process may thin one or more of the IC chips, removing chip substrate material as needed to fully expose all IC chips at some nominal assembly height. Once all IC chips are exposed, at block 125 a bondable material may be deposited over the exposed inactive side of the IC chips. As one example, a metallization layer may be deposited over the exposed side of the IC chips. This back-side metallization layer may have any composition and any thickness, but in some advantageous embodiments, the back-side metallization has a thickness of less than 10 µm. Other bond materials, such as a $SiO_2$ may also be deposited (or grown) on the inactive IC chip surface to similarly prepare the inactive surface for subsequent bonding.

Figure 2C:
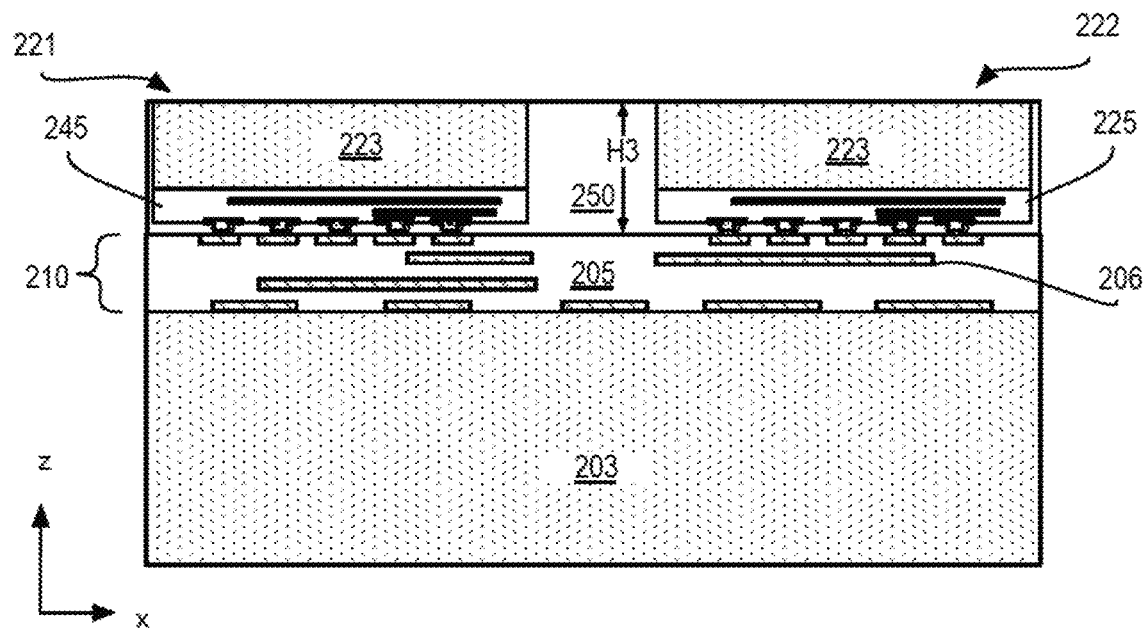
Figure 2D:
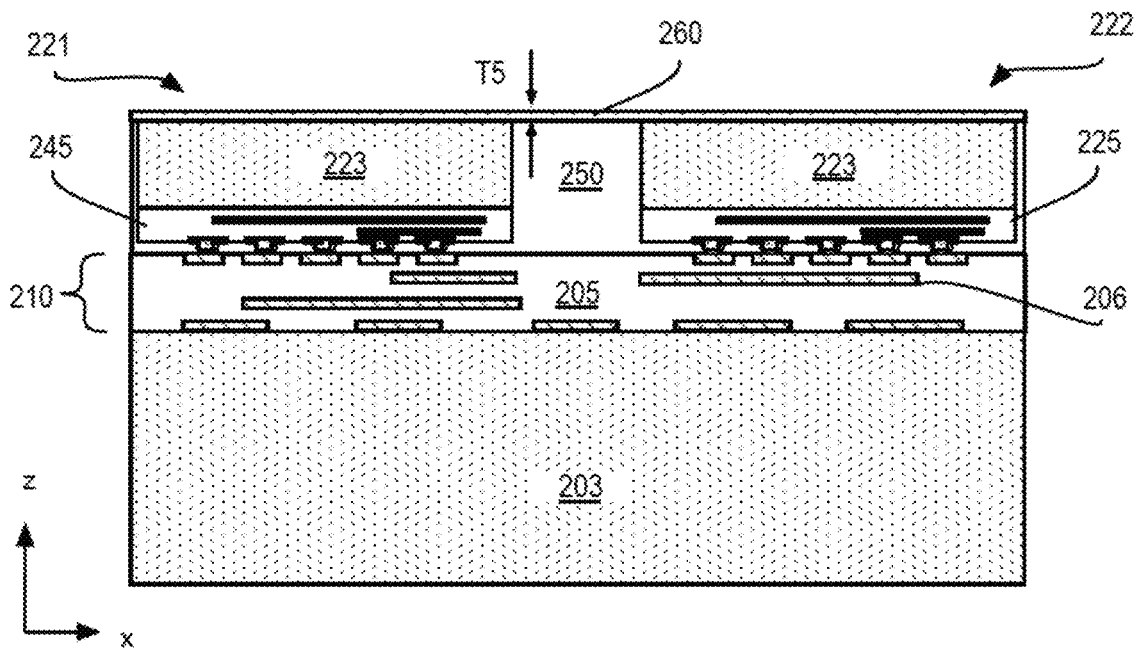

In the example further illustrated in FIG. 2C, an overmold planarization process has thinned mold material 250, exposing a back side of each of IC chips 221, 222, and reducing their corresponding assembly heights to a nominal assembly height H3. Although assembly height H3 may vary with implementation, in some examples assembly height H3 is between 100 µm and 150 µm. Hence, in this example, the overmold planarization process has removed variation in the thickness of chip substrate 223. As further shown in FIG. 2D, a back-side bond material 260 is in contact with each chip substrate 223, and is also in contact with mold material 250 within spaces between IC chips 221, 222. As such, it is evident back-side bond material 260 was not formed on chip substrate 223 prior to application of mold material 250. Although the composition of back-side bond material 260 may vary, in some examples bond material 260 comprises a layer of metallization (e.g., Cu, Au, In, Sn, Ag, Bi, or Ni, and alloys thereof). In other embodiments, bond material 260 is $SiO_2$. Back-side bond material 260 may advantageously have a thickness T5 of only a few microns (e.g., >10 µm), and may even be significantly less than 1 µm.

Returning to FIG. 1, methods 101 continue at block 130 where a heat spreader is directly bonded to the plurality of IC chips. The heat spreader has good thermal conductivity (e.g., more than 100 W/mK at 25° C.) over a plane of spreader and/or through a z-thickness of the spreader. The heat spreader is also to have sufficient mechanical strength and sufficient flatness to contact each of the IC chips and ultimately become the primary support of the assembly to which is bonded. The heat spreader has at least one surface that can be permanently bonded to the IC chips. Depending on the composition of the spreader, the bondable surface may comprise a layer of bond material having a composition distinct from that of the bulk of the heat spreader. Thickness of the bond material layer may vary as needed to accommodate non-planarity in the workpiece.

Bonding of the heat spreader may comprise one or more surface treatments of either, or both, the heat spreader surface and IC chip surfaces. Any suitable thermal/compression bonding technique may be utilized to sinter or otherwise form an intimate bond between the heat spreader and each of the IC die of the assembly. In some examples, solder is employed to bond the heat spreader to the inactive side of the IC chips. Such embodiments may have a BLT as little as 5-25 µm, for example. The solder may include a Sn alloy (e.g., SnSb, AuSi, SnCu, SAC, etc.), for example. If solder is employed, a re-melting temperature of the spreader-IC chip bond is advantageously higher than that of typical die FLI and/or package SMT soldering temperatures. Therefore, in some embodiments, a low-temperature solder (LTS) composition, for example having a melting temp of around 175 C, is employed for FLI (e.g., block 110). LTS may be similarly enlisted for subsequently formed SMT solder interconnects of a package substrate. The use of LTS for these applications will enable the heat spreader to be solder bonded with a variety of higher temperature solder compositions (e.g., having a melting temp. of 200-245 C).

In other embodiments, metal sintering (e.g., Cu—Cu bonding with or without Sn) may be used for bonding the heat spreader to the back-side of the IC chips. Dielectric (e.g., silicon dioxide-silicon dioxide) bonding, Si—Si or SiO—Si bonding may also be practiced. Any of these bonding techniques will have a BLT of less than 1 μm. For the metal bonds, Cu may be deposited on each of heat spreader and the IC chip backside as the bond material layers (e.g., at block 125 of methods 101). For the $SiO_2$—$SiO_2$ embodiments, the oxide material (e.g., $SiO_2$) may be grown on a silicon heat spreader as the bond material layer, and/or grown on the back side of a silicon IC chip substrate as the back-side bond material. For the Si—Si embodiments, native oxide material (e.g., $SiO_2$) may be removed from both a silicon heat spreader and the back side of a silicon IC chip substrate prior to bonding. In other embodiments, a thin die bond film (DBF) or other polymer film or thermal interface material may be applied to the heat spreader as the bond material layer, or applied to IC chips as the back-side bond material. Such embodiments may have a BLT of anywhere from 5-25 μm, for example.

Figure 2E:
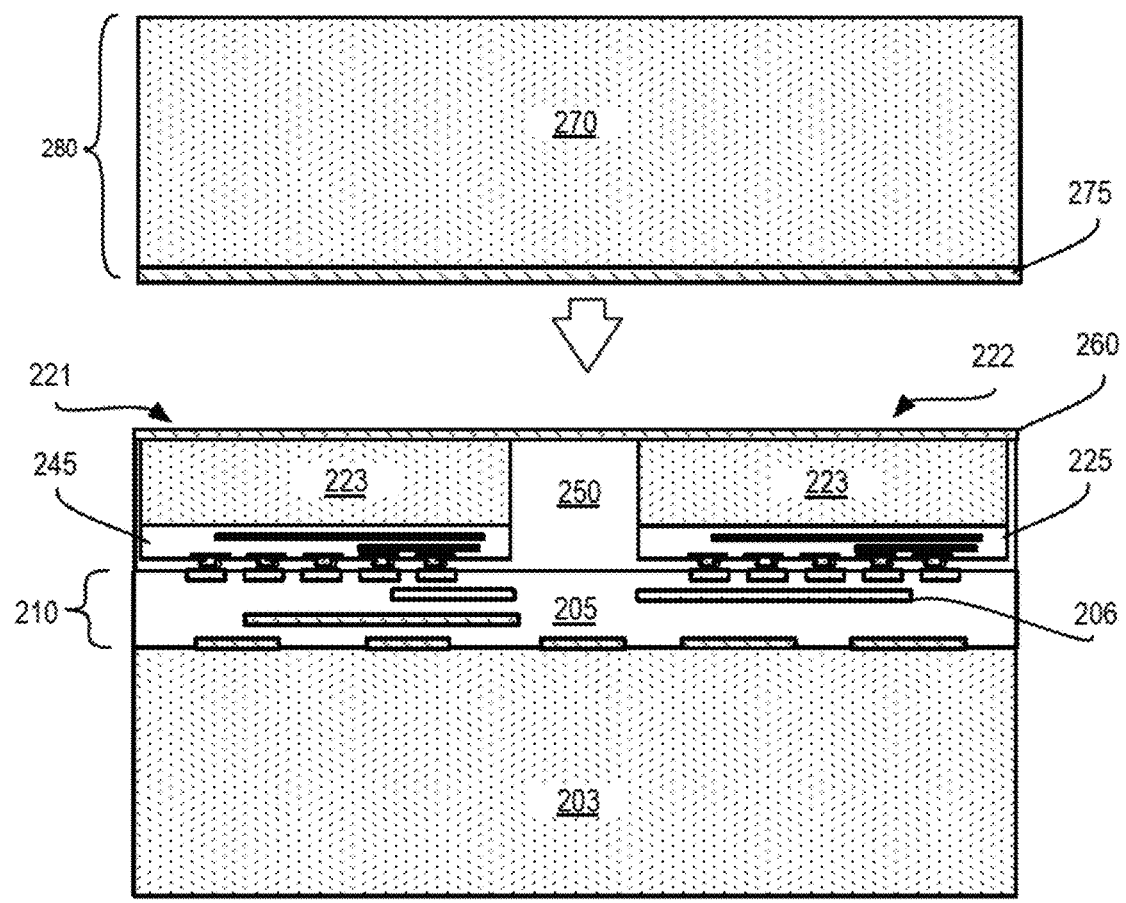

In the example further illustrated in FIG. 2E, a heat spreader 280 comprising a bulk substrate 270 and a bond material 275 is bonded to back-side bond material 260. In some embodiments, bulk substrate 270 is predominantly silicon (e.g., substantially single-crystalline silicon). For examples where the interposer is a silicon wafer, heat spreader 280 may also be a silicon wafer of substantially the same diameter (e.g., 300 mm) such that the bonding process is a wafer-level process. A silicon heat spreader 280 may also be of substantially the same thickness as the interposer (e.g. 400-750 μm), although the heat spreader thickness may vary widely. Bond material 275 may have any of the above compositions (e.g., solder, Cu, Au, $SiO_2$, polymer) etc., and any thickness suitable for bonding to back-side bond material 260 (or to chip substrate 233 where a —Si bond is formed). Notably, BLT of the joint between heat spreader 280 and IC chips 221, 222 may be very thin. For example, whereas a heat spreader may typically be joined to a substrate with a BLT of tens of microns (e.g., 15-100 μm, or more), bond material(s) 265 and/or 275 may advantageously combine to a BLT of less than 10 μm, or even less than 1 μm.

Returning to FIG. 1, methods 101 continue at block 135 where the interposer is removed to expose a second side of the RDL structure. With the mechanical support of the bonded heat spreader (now fully integrated with the IC chips), the interposer may be completely removed as sacrificial without concern of failure in the RDL structure. The interposer may be removed by one or more of grinding, polishing, or chemical etching. For example, a grinding process may be performed to remove most of the interposer, and a chemical etch subsequently performed to remove a remainder of the interposer selectively the RDL structure.

Since the integrated heat spreader further functions to improve thermal conduction and/or dissipation of heat from the IC chips, the integrated heat spreader offers both mechanical and thermal advantages. Following exposure of the RDL structure, additional interconnects may then be formed on the second side of the RDL structure at block 140. Any interconnect suitable for attachment of a IC die to a package substrate, or other host, may be formed at block 140. For example, copper pillars or bumps may be formed on the exposed surface of the RDL structure, and solder caps formed on those bumps. The solder may further bond to metallization features of a substrate. Ball grid interconnects (BGI), or any other solder interconnect suitable for SMT processing may also be formed on the exposed surface of the RDL. As noted above, any solder employed for these interconnects may be selected to have a melt temperature below that of any solder employed to bond the heat spreader to the IC chips so that the heat spreader bond is maintained. Methods 101 may then be completed at block 145 where the wafer-level or panel-level workpiece is diced to singulate the multi-chip units in preparation for their electrical test and/or subsequent assembly onto a package substrate or other host surface. In general, the multi-chip units assembled according to methods 101 are suitable for any further package-level assembly techniques known for interfacing a single IC chip to a package substrate or to any other higher-level system-level assembly.

Figure 2F:
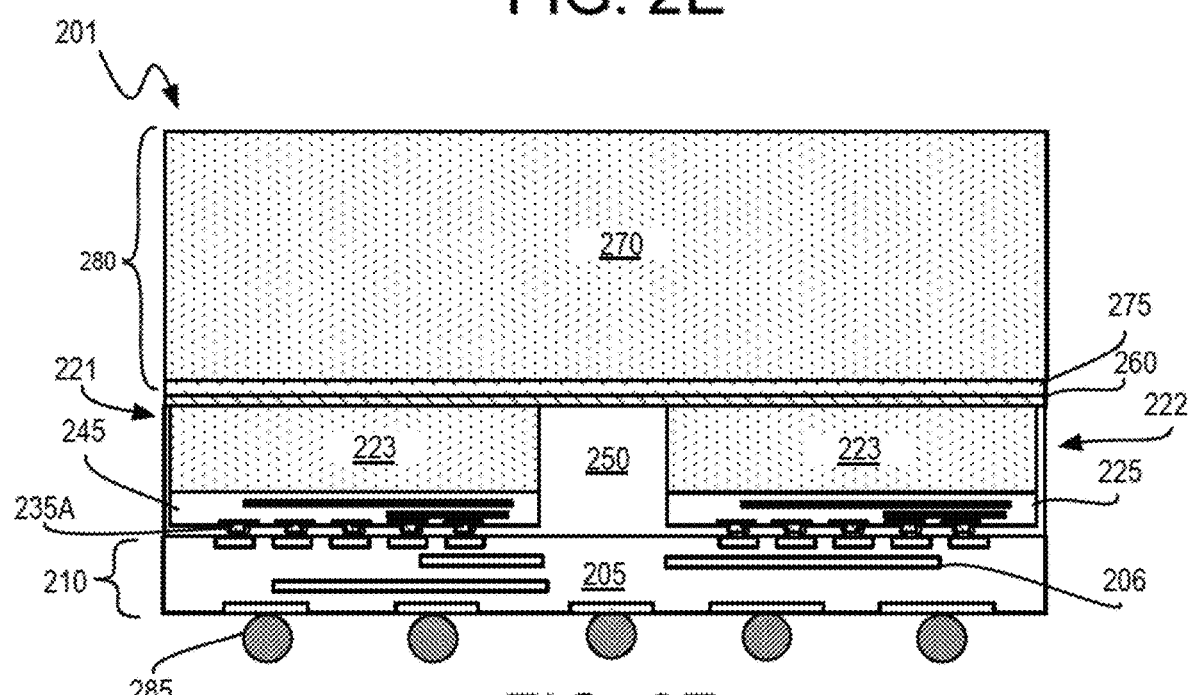

In the example illustrated in FIG. 2F, a multi-chip unit 201 is substantially complete with interposer 203 having been removed from RDL structure 210. For exemplary embodiments where interposer 203 was silicon, a grinding process followed by a chemical silicon etch process may remove interposer 203 selectively to dielectric and/or metallization of RDL structure 210. As further shown, solder features 285 are formed on RDL metallization exposed on a side opposite IC chips 221 and 222, for example with any suitable ball attach or paste dispense process. Solder features 285 may be larger in diameter (e.g., hundreds of μm) than FLI solder features 235 (e.g., less than 100 μm). Multi-chip unit 201 may then be singulated by cutting, laser ablating, or otherwise milling through integrated heat spreader 280, mold material 250, and RDL structure 210, for example. In singulated form, multi-chip unit 201 is ready for package-level integration where BGI solder features 285 may be attached to a host substrate (not depicted), such as a package substrate, or the like.

Figure 3:
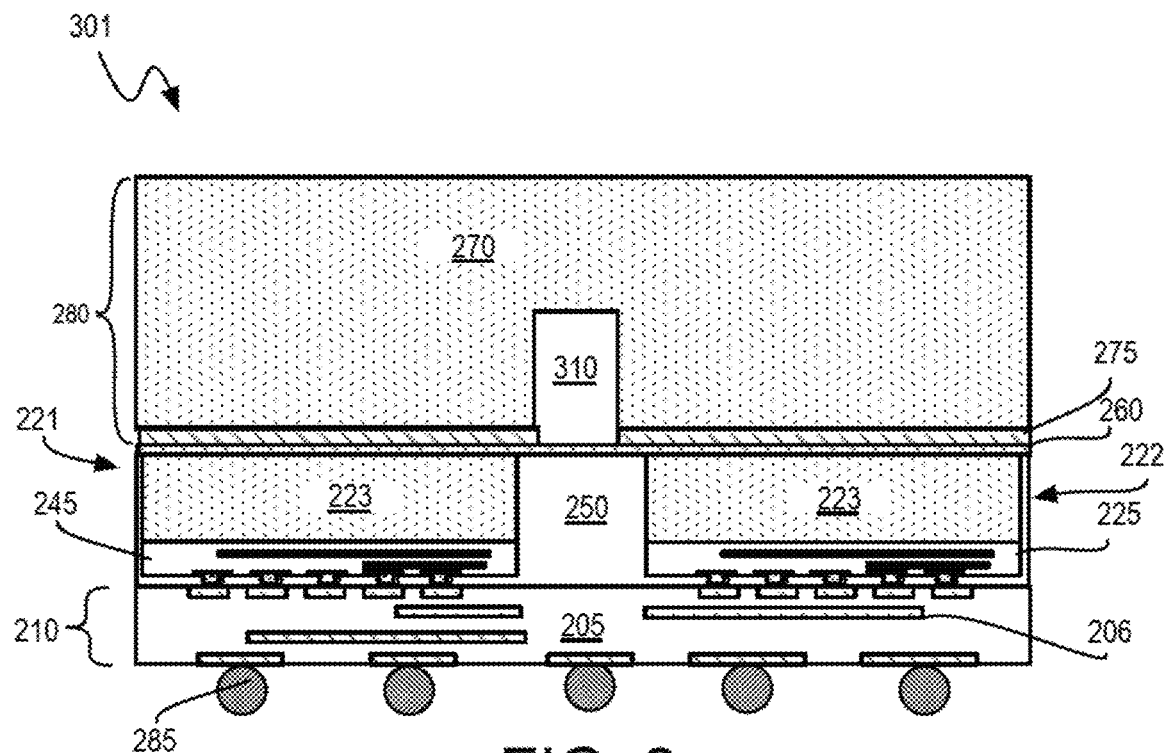
FIGS. 3 and 4 illustrate cross-sectional views of multi-chip units, in accordance with some alternative embodiments.

In some embodiments a heat spreader bonded to a plurality of IC chips within a multi-chip unit includes one or more grooves between at least some of the IC chips. Such machining of the heat spreader may be performed prior to bonding the heat spreader to the IC chips, for example. In some embodiments, grooves are machined into the heater spreader so as to minimize thermal cross talk between select ones of the bonded IC chips. FIG. 3 illustrates a cross-sectional view of a multi-chip unit 301, in accordance with some such embodiments. Reference labels from multi-chip unit 201 (FIG. 2F) are repeated in multi-chip unit 301 (FIG. 3) to indicate analogous elements, which may have any of the same attributes described above. In multi-chip unit 301, heat spreader 280 has been machined chemical etched, or laser ablated, for example, to include a groove or recess 310 in a surface facing IC chips 221, 222. As shown, groove 310 is located over mold material 250, approximately within the space between IC chips 221, 222. Groove 310 may be filled with any material having lower thermal conductivity than heat spreader 280. Alternatively, groove 310 may be left unfilled, for example as an air gap.

Figure 4:
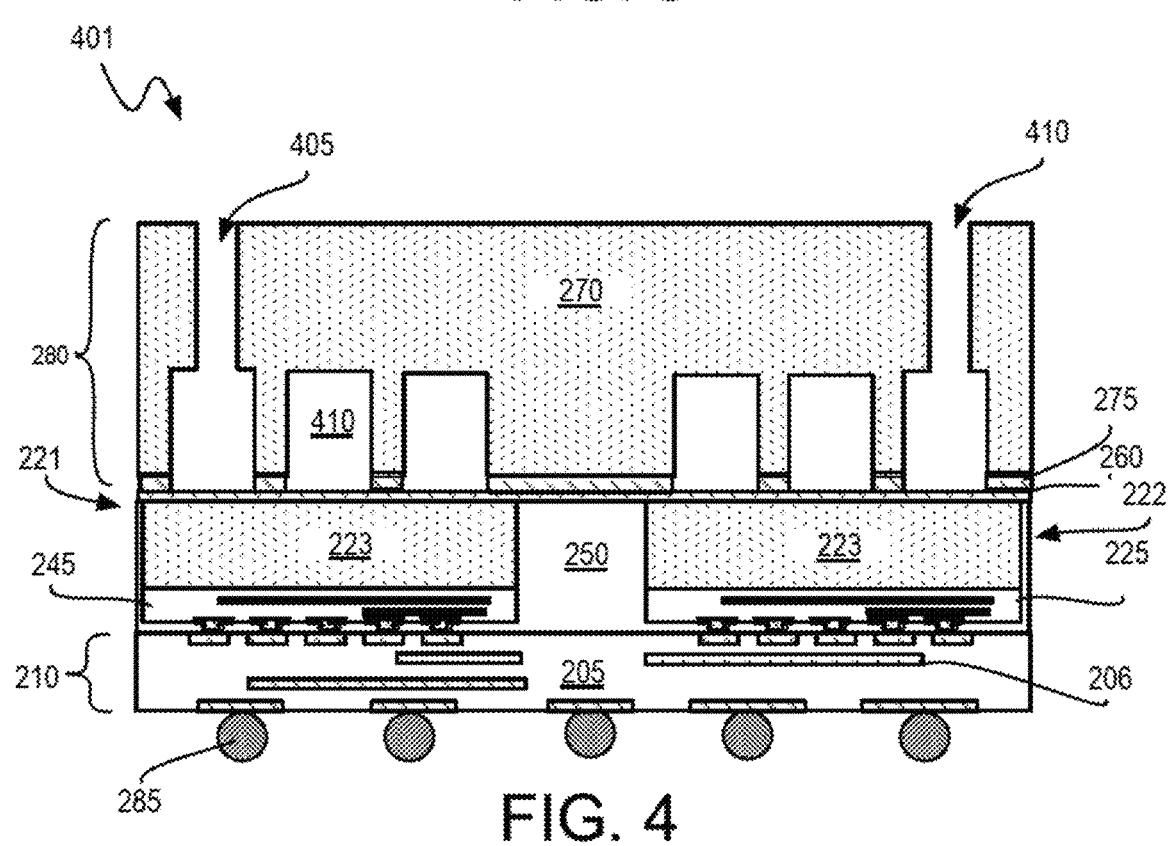

The bonding surface and/or the opposing surface of the integrated heat spreader may also be patterned to facilitate heat extraction from the multi-chip unit. For example, the heat spreader may be machined to include micro-channels through which a coolant fluid may transfer heat away from the IC chips. The heat spreader is an ideal platform to cost-effectively create micro-channels very close to the heat source as a result of the very small BLT between the heat spreader and the IC chips. FIG. 4 is a cross-sectional view of a multi-chip unit 401, in accordance with some embodiments. Reference labels from multi-chip unit 201 (FIG. 2F) are repeated in multi-chip unit 401 (FIG. 4) to indicate analogous elements, which may have any of the same attributes described above in the context of multi-chip unit 201. In multi-chip unit 401, heat spreader 280 includes one or more channels or grooves 410 on a side of bulk substrate 270 facing IC chips 121, 122. Channels 410 may have any dimension and may be machined or etched into bulk substrate 270 with any suitable technique. As shown, channels 410 place a coolant inlet 405 located over IC chip 221 in fluid communication with a coolant outlet 410 located over IC chip 222. Coolant inlet 405 and outlet 410 each open into the opposing side of heat spreader 280. The Multi-chip unit 401 may therefore be further integrated into a system that includes a coolant fluid supply loop that can be coupled with inlet 405 and outlet 410.

Figure 5:
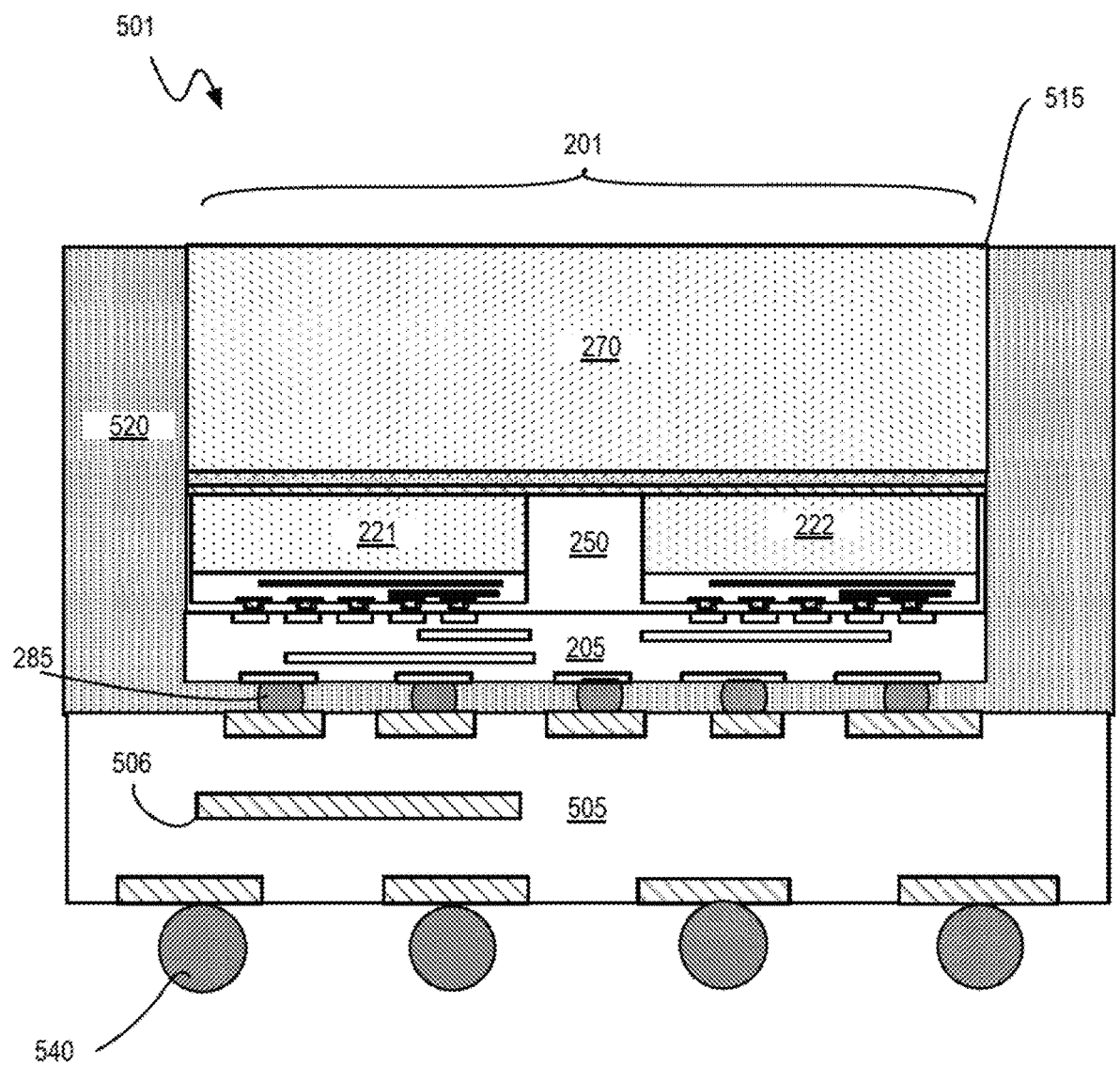
FIG. 5 illustrates a system that includes a multi-chip unit, in accordance with some embodiments.

FIG. 5 illustrates an exemplary exposed die mold (EDM) package 501 that includes multi-chip unit 201 where a single monolithic IC chip might otherwise be located. A package mold material 520 is adjacent to a sidewall of heat spreader substrate 270. Package mold material 520 is also adjacent to a sidewall of mold material 250, as well as a sidewall of RDL structure 210. Package mold material 520 may be any of the materials described above for mold material 250. Package mold material 520 may have the same composition as mold material 250, or the mold materials may be of different composition. As shown, rather than exposing a back side of either IC chip 221 or 222, a surface 515 of heat spreader substrate 270 is instead exposed at the EDM package level.

EDM package 501 further includes a package substrate 505 electrically interconnected to RDL structure 210 through BGI solder features 285. EDM package 501 includes one or more levels of metallization 506 which may redistribute and/or space transform BGI interconnects 285 to a larger pitch associated with packing interconnects 540. EDM package 501 may be singulated according to any suitable technique and subsequently attached through package interconnects 540 to a host, such as system level PCB. Although an EDM package is illustrated in FIG. 5, this is only one example of how multi-chip unit 201 may be integrated into a package to further illustrate how multi-chip unit 201 may be packaged substantially like an individual monolithic IC chip. As such, any conventional techniques may be applied to integrate multi-chip unit 201 into any of a wide variety of other IC chip packages that have been designed for single monolithic IC chip.

Once embedded with a package, a multi-chip unit may be further interfaced with package-level thermal solutions to dissipate heat away from the integrated heat spreader. Any suitable package level thermal management components may be applied over the heat spreader. For example, a pad of thermal interface material (not depicted) may be applied over the exposed surface 515. A package-level, or system-level heat sink (not depicted) may be further applied over the thermal interface material.

Figure 6:
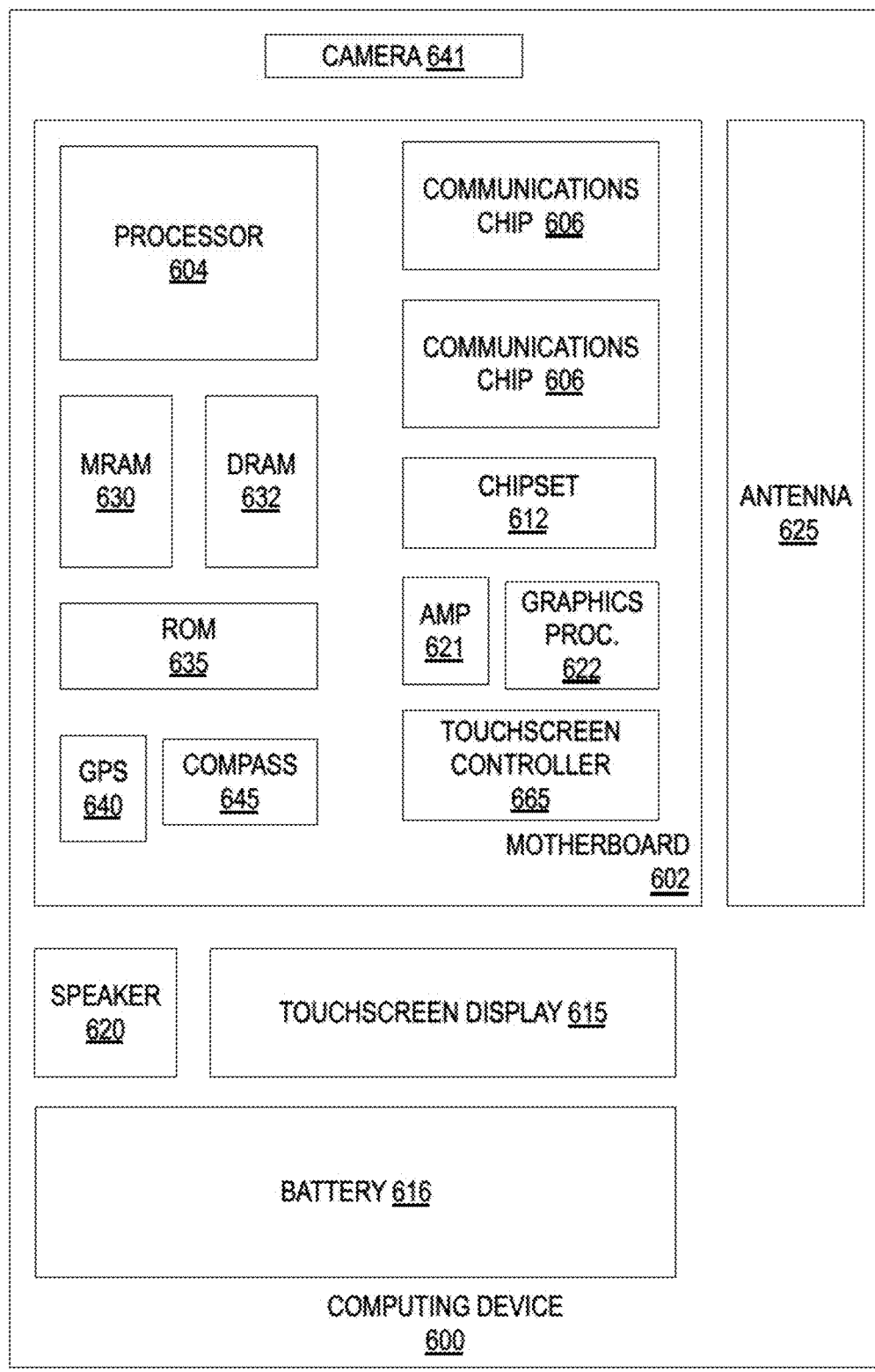
FIG. 6 is a functional block diagram of an electronic computing device, in accordance with some embodiments.

FIG. 6 is a functional block diagram of an electronic computing device 600, in accordance with an embodiment of the present invention. Device 600 further includes a motherboard 602 hosting a number of components, such as, but not limited to, a processor 604 (e.g., an applications processor). Processor 604 may be physically and/or electrically coupled to motherboard 602. In some examples, processor 604 includes a package having a multi-chip unit bonded to an integrated heat spreader, for example as described elsewhere herein. In general, the term "processor" or "microprocessor" may refer to any device or portion of a device that processes electronic data from registers and/or memory to transform that electronic data into other electronic data that may be further stored in registers and/or memory.

In various examples, one or more communication chips 606 may also be physically and/or electrically coupled to the motherboard 602. In further implementations, communication chips 606 may be part of processor 604. Depending on its applications, computing device 600 may include other components that may or may not be physically and electrically coupled to motherboard 602. These other components include, but are not limited to, volatile memory (e.g., DRAM 632), non-volatile memory (e.g., ROM 635), flash memory (e.g., NAND or NOR), magnetic memory (MRAM 630), a graphics processor 622, a digital signal processor, a crypto processor, a chipset 612, an antenna 625, touchscreen display 615, touchscreen controller 665, battery 616, audio codec, video codec, power amplifier 621, global positioning system (GPS) device 640, compass 645, accelerometer, gyroscope, speaker 620, camera 641, and mass storage device (such as hard disk drive, solid-state drive (SSD), compact disk (CD), digital versatile disk (DVD), and so forth), or the like. In some exemplary embodiments, at two of the functional blocks noted above are within one package as two IC chips of a multi-chip unit that are both bonded to an integrated heat spreader, for example as described elsewhere herein.

Communication chips 606 may enable wireless communications for the transfer of data to and from the computing device 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chips 606 may implement any of a number of wireless standards or protocols. As discussed, computing device 600 may include a plurality of communication chips 606. For example, a first communication chip may be dedicated to shorter-range wireless communications, such as Wi-Fi and Bluetooth, and a second communication chip may be dedicated to longer-range wireless communications such as GPS, EDGE, GPRS, CDMA, WiMAX, LTE, Ev-DO, and others.

Figure 7:
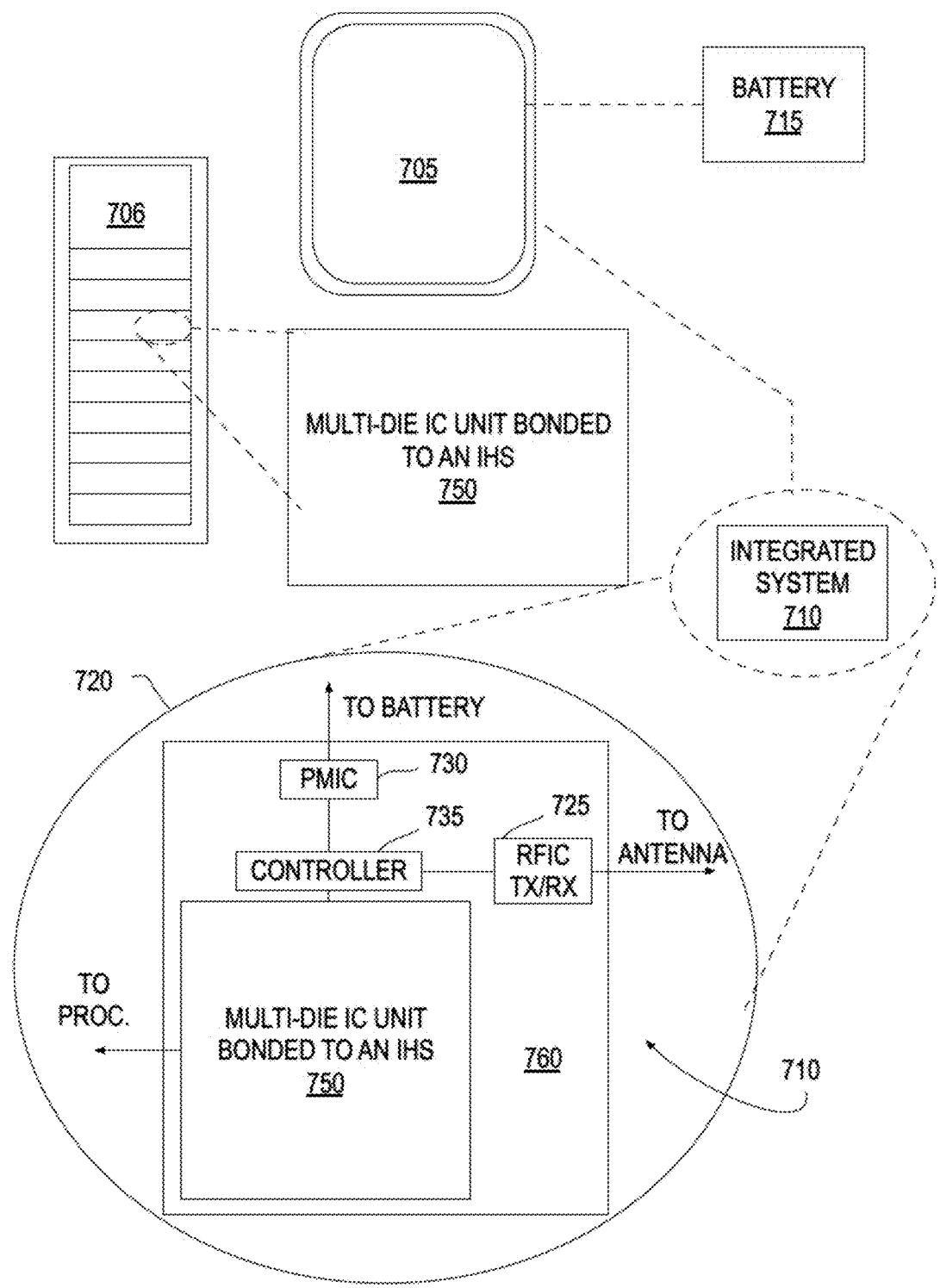
FIG. 7 illustrates a mobile computing platform and a data server machine employing an IC package including an EMI shielding heat spreader comprising graphite, in accordance with some embodiments.

FIG. 7 illustrates a mobile computing platform and a data server machine employing an IC package with an EMI shielding heat spreader comprising graphite, for example as described elsewhere herein. Computing device 600 may be found inside platform 705 or server machine 706, for example. The server machine 706 may be any commercial server, for example including any number of high-performance computing platforms disposed within a rack and networked together for electronic data processing, which in the exemplary embodiment includes a packaged multi-chip unit 750 that is bonded to an integrated heat spreader, for example as described elsewhere herein. The mobile computing platform 705 may be any portable device configured for each of electronic data display, electronic data processing, wireless electronic data transmission, or the like. For example, the mobile computing platform 705 may be any of a tablet, a smart phone, laptop computer, etc., and may include a display screen (e.g., a capacitive, inductive, resistive, or optical touchscreen), a chip-level or package-level integrated system 710, and a battery 715.

Whether disposed within the integrated system 710 illustrated in the expanded view 720, or as a stand-alone package within the server machine 706, IC package 750 may include a multi-chip unit bonded to an integrated heat spreader, for example as described elsewhere herein. IC package 750 may be further coupled to a board, or other host substrate, along with, one or more of a power management integrated circuit (PMIC) 730, RF (wireless) integrated circuit (RFIC) 725 including a wideband RF (wireless) transmitter and/or receiver (TX/RX) (e.g., including a digital baseband and an analog front end module further comprises a power amplifier on a transmit path and a low noise amplifier on a receive path), and a controller 735. PMIC 730 may perform battery power regulation, DC-to-DC conversion, etc., and so has an input coupled to battery 715 and with an output providing a current supply to other functional modules. As further illustrated, in the exemplary embodiment, RFIC 725 has an output coupled to an antenna (not shown) to implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 4G, and beyond.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

It will be recognized that the invention is not limited to the embodiments so described, but can be practiced with modification and alteration without departing from the scope of the appended claims. For example the above embodiments may include specific combinations of features as further provided below.

In first examples, an integrated circuit (IC) chip assembly comprises a first chip comprising a first integrated circuit, and a second chip comprising a second integrated circuit. The first chip is adjacent to the second chip and an active side of the first and second chips is interconnected to a first side of a metallized redistribution structure. The metallized redistribution structure has a second side, opposite the first side, to receive a plurality of solder interconnects. A mold material is between the first and second chips. A heat spreader is bonded to an inactive side of both the first and second chips, opposite the metallized redistribution structure.

In second examples, for any of the first examples the metallized redistribution structure has a thickness less than 50 μm.

In third examples, for any of the first through second examples a bond line thickness (BLT) between the heat spreader and the inactive side of both the first and second chips is less than 10 μm.

In fourth examples, for any of the third examples the BLT comprises one or more metal.

In fifth examples, for any of the fourth examples, the metal is one of Cu, Au, In, Sn, Bi or Ag.

In sixth examples for any of the third examples the BLT comprises Si—O or Si—Si bonds between the heat spreader and the first and second IC chips.

In seventh examples, for any of the first through sixth examples the IC chip assembly further comprises a second mold material adjacent to a sidewall of the heat spreader, and a package substrate including one or more levels of metallization. A first side of the package substrate is interconnected to the metallized redistribution structure through the plurality of solder interconnects, and wherein a second side of the package substrate is to receive a second plurality of solder interconnects.

In eighth examples, for any of the first through seventh examples the mold material has a thermal conductivity less than 4 W/mK, and the heat spreader has a thermal conductivity of at least 100 W/mK.

In ninth examples, for any of the first through eighth examples the heat spreader comprises predominantly silicon and has a thickness of at least 200 μm, and wherein the first IC chip has substantially the same thickness as the second IC chip.

In tenth examples, for any of the first through ninth examples, the heat spreader comprises one or more surface recesses in a first surface of the heat spreader that faces the inactive side of the first and second IC chips.

In eleventh examples, for any of the tenth examples the surface recesses comprise a microchannel that is coupled to a pair of openings in a second side of the heat spreader, opposite the first surface.

In twelfth examples, for any of the first through eleventh examples, the first IC chip is interconnected to the metallized redistribution structure through a first set of solder features, and the second IC chip is interconnect to the metallized redistribution structure through a second set of solder features.

In thirteenth examples, a computer system comprises a power supply, a system component comprising interconnect circuitry, and one or more integrated circuit packages coupled to the power supply through the system component. At least one of the integrated circuit packages further comprises a package substrate interconnected to the system component by first solder features and to a first side of a metallized redistribution structure by second solder features. The packages further comprise a first chip comprising a first integrated circuit, and a second chip comprising a second integrated circuit. The first chip is adjacent to the second chip, and an active side of the first and second chips is interconnected to a second side of the metallized redistribution structure, opposite the first side The packages comprise a first mold material between the first and second chips, and a heat spreader bonded to an inactive side of both the first and second chips, opposite the metallized redistribution structure.

In fourteenth examples, for any of the thirteenth examples the metallized redistribution structure has a thickness less than 50 μm. A bond line thickness (BLT) between the heat spreader and the inactive side of both the first and second chips is less than 10 μm, and a second mold material is adjacent to a sidewall of the heat spreader, and over a portion of the package substrate.

In fifteenth examples, for any of the fourteenth examples, the computer system further comprises a heat sink over a surface of the heat spreader that is not covered by the second mold material.

In sixteenth examples, a method of assembling a plurality of integrated circuit (IC) chips comprises receiving an interposer with a metallized redistribution structure on a first side of the interposer. The method comprises attaching an active side of at least a first IC chip and a second IC chip to a first side of the metallized redistribution structure. The method comprises bonding a heat spreader to an inactive side of the first and second IC chips. The method comprises exposing a second side of the metallized redistribution structure by removing the interposer. The method comprises forming interconnect features coupled to the second side of the metallized redistribution structure.

In seventeenth examples, for any of the sixteenth examples the methods further comprises forming a dielectric material between a sidewall surface of the first and second IC chips, and exposing the inactive side of the first and second IC chips by planarizing the dielectric material.

In eighteenth examples, for any of the sixteenth through seventeenth examples planarizing the dielectric material exposes a first of the IC chips before a second of the IC chips, and wherein the planarizing thins the first of the IC chips more than the second of the IC chips.

In nineteenth examples, for any of the sixteenth through eighteenth examples, bonding the heat spreader to the inactive side of the first and second IC chips comprises a thermal compression bonding process that produces a bond having a bond line thickness less than 10 μm.

In twentieth examples, for any of the sixteenth through nineteenth examples forming the dielectric material comprises molding an epoxy having a thermal conductivity at least two orders of magnitude smaller than that of the heat spreader, around a perimeter of both the first and second IC chips.

However, the above embodiments are not limited in this regard and, in various implementations, the above embodiments may include the undertaking of only a subset of such features, undertaking a different order of such features, undertaking a different combination of such features, and/or undertaking additional features than those features explicitly listed. The scope of the invention should therefore be determined with reference to the appended claims, along with the full scope of equivalents to which such claims are entitled.

What is claimed is:

1. An integrated circuit package, comprising:
    a redistribution layer (RDL) structure having a first sidewall and a second sidewall, the second sidewall laterally opposite to the first sidewall;
    a first integrated circuit chip on the RDL structure, the first integrated circuit chip comprising a first silicon substrate over an active region, the first silicon substrate having a backside opposite the active region, and the first silicon substrate having a first sidewall and a second sidewall between the active region and the backside, the second sidewall laterally opposite the first sidewall;
    a second integrated circuit chip on the RDL structure, the second integrated circuit chip laterally spaced apart from the first integrated circuit chip, the second integrated circuit chip comprising a second silicon substrate over an active region, the second silicon substrate having a backside opposite the active region, and the second silicon substrate having a first sidewall and a second sidewall between the active region and the backside, the second sidewall laterally opposite the first sidewall;
    a dielectric material layer laterally between and in contact with the second sidewall of the first silicon substrate and the first sidewall of the second silicon substrate, the dielectric material in contact with the RDL structure;
    a back-side bond material over the backside of the first silicon substrate, over the dielectric material layer, and over the backside of the second silicon substrate;
    a bond material over the back-side bond material, the bond material separate and distinct from the back-side bond material;
    a heat spreader over the bond material, the heat spreader having a first sidewall and a second sidewall, the second sidewall laterally opposite to the first sidewall, wherein the first sidewall of the heat spreader is in vertical alignment with the first sidewall of the RDL structure, and the second sidewall of the heat spreader is in vertical alignment with the second sidewall of the RDL structure; and
    a package mold material adjacent to a sidewall of the dielectric material and a sidewall of the RDL structure.

2. The integrated circuit package of claim 1, wherein the dielectric material is further in contact with the first sidewall of the first silicon substrate and the second sidewall of the second silicon substrate.

3. Integrated circuit package of claim 1, wherein the dielectric material layer comprises silicon and oxygen.

4. The integrated circuit package of claim 1, wherein the dielectric material layer has a bulk thermal conductivity less than 5 W/mK.

5. The integrated circuit package of claim 1, further comprising:
    solder features on the RDL structure, the solder features on a side of the RDL structure opposite the first integrated circuit chip and the second integrated circuit chip.

6. The integrated circuit package of claim 1, wherein the bond material comprises solder.

7. The integrated circuit package of claim 1, wherein the bond material comprises copper.

8. The integrated circuit package of claim 1, wherein the bond material comprises gold.

9. The integrated circuit package of claim 1, wherein the bond material comprises silicon and oxygen.

10. The integrated circuit package of claim 1, wherein the heat spreader comprises single-crystalline silicon.

11. A method of fabricating an integrated circuit package, the method comprising:
    coupling a first integrated circuit chip to a redistribution layer (RDL) structure, the RDL structure having a first sidewall and a second sidewall, the second sidewall laterally opposite to the first sidewall, the first integrated circuit chip comprising a first silicon substrate over an active region, the first silicon substrate having a backside opposite the active region, and the first silicon substrate having a first sidewall and a second sidewall between the active region and the backside, the second sidewall laterally opposite the first sidewall;
    coupling a second integrated circuit chip to the RDL structure, the second integrated circuit chip laterally spaced apart from the first integrated circuit chip, the second integrated circuit chip comprising a second silicon substrate over an active region, the second silicon substrate having a backside opposite the active region, and the second silicon substrate having a first sidewall and a second sidewall between the active region and the backside, the second sidewall laterally opposite the first sidewall;

forming a dielectric material layer laterally between and in contact with the second sidewall of the first silicon substrate and the first sidewall of the second silicon substrate, the dielectric material in contact with the RDL structure;

forming a back-side bond material over the backside of the first silicon substrate, over the dielectric material layer, and over the backside of the second silicon substrate;

forming a bond material over the back-side bond material, the bond material separate and distinct from the back-side bond material;

coupling a heat spreader to the bond material, the heat spreader having a first sidewall and a second sidewall, the second sidewall laterally opposite to the first sidewall, wherein the first sidewall of the heat spreader is in vertical alignment with the first sidewall of the RDL structure, and the second sidewall of the heat spreader is in vertical alignment with the second sidewall of the RDL structure; and forming a package mold material adjacent to a sidewall of the dielectric material and a sidewall of the RDL structure.

12. The method of claim 11, wherein the dielectric material is further in contact with the first sidewall of the first silicon substrate and the second sidewall of the second silicon substrate.

13. The method of claim 11, wherein the dielectric material layer comprises silicon and oxygen.

14. The method of claim 11, wherein the dielectric material layer has a bulk thermal conductivity less than 5 W/mK.

15. The method of claim 11, further comprising:
forming solder features on the RDL structure, the solder features on a side of the RDL structure opposite the first integrated circuit chip and the second integrated circuit chip.

16. The method of claim 11, wherein the bond material comprises solder.

17. The method of claim 11, wherein the bond material comprises copper.

18. The method of claim 11, wherein the bond material comprises gold.

19. The method of claim 11, wherein the bond material comprises silicon and oxygen.

20. The method of claim 11, wherein the heat spreader comprises single-crystalline silicon.

* * * * *